(12) United States Patent
Koch

(10) Patent No.: US 7,516,429 B2
(45) Date of Patent: Apr. 7, 2009

(54) SYSTEM FOR ANALYZING AN ELECTRONIC CIRCUIT DESCRIBED BY CHARACTERIZATION DATA

(75) Inventor: Klaus Koch, München (DE)

(73) Assignee: Infineon Technologies AG, Münich (DE)

(*) Notice: Subject to any disclaimer, the term of this patent is extended or adjusted under 35 U.S.C. 154(b) by 352 days.

(21) Appl. No.: 11/443,502

(22) Filed: May 30, 2006

(65) Prior Publication Data
US 2006/0294479 A1 Dec. 28, 2006

(30) Foreign Application Priority Data
May 30, 2005 (DE) ............... 10 2005 024 655

(51) Int. Cl.
*G06F 17/50* (2006.01)
(52) U.S. Cl. .......................... 716/4; 703/2
(58) Field of Classification Search ............... None
See application file for complete search history.

(56) References Cited

U.S. PATENT DOCUMENTS 5,819,205 A 10/1998 Mani
6,272,664 B1 8/2001 Chang et al.
6,732,341 B1 5/2004 Chang et al.
7,296,250 B2 * 11/2007 Lang et al. ............... 716/4

FOREIGN PATENT DOCUMENTS

JP 05012325 A * 1/1993

OTHER PUBLICATIONS

MacMillen et al., "An Industrial View of Electronic Design Automation," IEEE Transactions on Computer Aided Design of Integrated Circuits and Systems, vol. 19, No. 12, Dec. 2000, pp. 1428-1448.

* cited by examiner

*Primary Examiner*—Leigh Marie Garbowski
(74) *Attorney, Agent, or Firm*—Brinks Hofer Gilson & Lione

(57) ABSTRACT

A system for analyzing an electronic circuit described by characterization data forms an interpolation/approximation function over an analysis interval for analyzing the electronic circuit. An edge detection is applied to the characterization data to determine edges in the data, with the detected edges as subinterval limits used to form subinterval functions which define the interpolation/approximation function. The interpolation/approximation function is continuously differentiable and monotonous in the subintervals.

21 Claims, 4 Drawing Sheets

SYSTEM FOR ANALYZING AN ELECTRONIC CIRCUIT DESCRIBED BY CHARACTERIZATION DATA

PRIORITY CLAIM

This application claims the benefit of priority of German Patent Application No. DE 10 2005 024 655.9, filed May 30, 2005, the contents of which are incorporated by reference herein.

BACKGROUND

1. Technical Field

The invention relates to analyzing an electronic circuit described by characterization data, in particular, when an interpolation/approximation function over an analysis interval is formed from the characterization data to analyze the electronic circuit

2. Background Information

In the development of electronic circuits, an important consideration is to check whether the specified functionality conditions are satisfied by the electronic circuit or in parts of the electronic circuit in the various operating points. This means that the designer and the design system, for example a computer aided design (CAD) system, must be provided with the opportunity for access to characterization data of the electronic circuit.

Such characterization data of an electronic circuit typically depends on variables, each variable component representing a desired analysis characteristic of the electronic circuit, for example power input, voltage, current, temperature, input/output state, noise, or other variables. Characterization data of an electronic circuit is data, e.g. voltage, current, temperature, etc. of said electronic circuit, for describing or characterizing said electronic circuit. This characterization data is measured in the electronic circuit within the electronic design automation (EDA) process, or is derived by simulation and used in a subsequent analysis process or in the next development step. Since the volume of the characterization data is very comprehensive for an appropriate reproduction of the characteristics of the electronic circuit, a method is required which is able to characterize the behavior of the electronic circuit as closely as possible to reality by as small a data volume as possible within the shortest possible time. Various conventional methods exist for this purpose which will be briefly outlined in the following.

One variant consists in providing the CAD system with multi-dimensional tables containing the characterization data. However, a large data storage volume may be required.

For example, non-linear delay times in electronic circuits may be recorded as characterization data. The non linear delay model (NLDM), which is a forerunner form of scalable polynomial model (SPM), was developed which, for example, models a cell delay and an output edge as a function of an input edge and an output capacity in a look-up table.

It is possible to reduce the data volume, for example, by representing the characterization data as a function. In this case, multi-dimensional interpolation/approximation polynomials may be used to represent the characterization data, so that then only polynomial coefficients have to be stored for the further processing. To improve the accuracy, polynomials of a higher degree may be selected which, however, these higher order polynomials exhibit greater oscillations between support points and thus the significance of the polynomials with respect to the actual circuit behavior is reduced. Lagrange polynomials in particular generally exhibit considerable oscillations, mainly in the region of interval limits.

According to the description language delay calculation language (DCL) (IEEE 1481), the problem is solved by allowing any functions as base functions and thus the characterization data is reproduced with sufficient accuracy while observing specific characteristics, for example continuity and monotony. However, this is associated with the difficulty of finding suitable base functions, so that this method cannot be automated or can only be automated with difficulty.

According to another possible approach, a compensating spline is initially calculated via the characterization data, where spline is then reduced into portion-wise polynomials according to the procedure in CAD programs. By using splines, a smooth course of an interpolation/approximation function is achieved, even at interfaces between the polynomials defined in portions. In this case, no discontinuity points or kinks appear in the curve, even up to a derivation degree which depends on the degree of the spline. The procedure of this method is outlined in brief with reference to FIG. 4.

Block 401 symbolizes the algorithm entry point and Block 450 symbolizes the algorithm end point. In block 402, as initialization, a complete analysis interval is defined as a subinterval, over which a polynomial is produced. At block 404, data points are then introduced as interval limits which are already present in other variables. At block 406, an interpolation/approximation using third order polynomials is carried out by the method of least squares using weight factors allocated to the data points. Thereafter, at block 408, an interpolation/approximation error is determined, for example by the chi-square method, according to different aspects.

Depending on a subsequent first check in at block 410 as to whether the interpolation/approximation error falls below a predetermined bound, if this is the case, a second check is carried out at block 412 with respect to the reproduction of the monotony behavior of the electronic circuit by the calculated interpolation/approximation function. If the result of the first check at block 410 is negative, the procedure is continued with an equidistant interval division or combination at block 418 in regions of insufficient interpolation/approximation accuracy.

In the event of a negative outcome of the second check at block 412, auxiliary points which are weighted for the interpolation/approximation are introduced at block 414 or weights at existing points are modified. A test is then carried out in a third check at block 416 to ascertain whether the aforementioned measure was successful, and dependent thereon, with a negative outcome, the process is continued with the equidistant interval division or combination at block 418 or, with a positive outcome, the interpolation/approximation is continued at block 406. In the event of interval division or combination at block 418, a verification of a new interval division is then carried out at block 420 and subsequently the interpolation/approximation in 406 is also continued.

The iterative process described hitherto is terminated by the second check at block 412 ending in a positive result, i.e. the previously manually predetermined global monotony behavior of the electrical circuit is reproduced with sufficient accuracy by the interpolation/approximation function. In this case, the polynomial representation is simplified at block 420, the results are converted into a format which may be read by CAD systems (typically a polynomial format, for example the Liberty-SPM format) at block 422 and finally stored at block 424.

All the prior art methods do not adequately reproduce the monotony behavior of the characterization data of the electronic circuit by the interpolation/approximation function of said methods based on an interpolation/approximation method used, which is expressed, for example by oscillations or overshooting and/or undershooting oscillators in the interpolation/approximation function. Consequently, the interpolation/approximation function may have extreme points and inflection points where the actual monotony curve according to the electronic circuit has none, or it does not have any where the actual curve does have some. The previously manually predetermined global monotony behavior is considered using the example of the last mentioned method, although the cost of this is the iterative process, which is possibly intensive in terms of running time, at block 414 for the insertion of auxiliary points or the modification of weight factors to data points which are already present. As a result of the insertion of auxiliary points and due to the potentially large number of subintervals and function coefficients which are to be stored and are connected thereto, the amount of data to be further processed may become very extensive. Moreover, at the start the operator must preset whether the function to be approximated/interpolated is monotonous in respect of a variable. A further restriction is the fact that this pre-setting always applies to the entire (global) functional course. Data points are possibly also removed in order to improve the monotony behavior according to the actual behavior of the electronic circuit.

A wrongly reproduced monotony behavior of the electronic circuit by the interpolation/approximation function results in artifacts which occur in the curve leading to a maloperation in the subsequent programs of the EDA process. For example, the "slew degradation" is wrongly determined if the first derivation of the interpolation/approximation function does not correspond to the actual behavior of the electronic circuit, or it is optimized in wrong directions due to incorrect extreme and inflection points, or the optimization methods of the EDA process start to oscillate and thereby converge to produce an invalid solution.

BRIEF SUMMARY

A method for analyzing an electronic circuit described by characterization data, an interpolation/approximation function from the characterization data being formed over an analysis interval for analyzing the electronic circuit, includes applying an edge detection to the characterization data to determine edges in the characterization data. Analysis intervals are subdivided into subintervals, where the subinterval limits between the subintervals correspond to the edges from applying the edge detection. The characterization data is interpolated/approximated in each subinterval by a respective subinterval function. The subinterval functions at the subinterval limits satisfy a predetermined interpolation condition and define the interpolation/approximation function over the analysis interval. The interpolation/approximation function is continuously differentiable and exhibits in the subintervals a monotonous curve.

Other systems, methods, features and advantages of the invention will be, or will become, apparent to one with skill in the art upon examination of the following figures and detailed description. It is intended that all such additional systems, methods, features and advantages be included within this description, be within the scope of the invention, and be protected by the following claims.

BRIEF DESCRIPTION OF THE DRAWINGS

The invention can be better understood with reference to the following drawings and description. The components in the figures are not necessarily to scale, emphasis instead being placed upon illustrating the principles of the invention. Moreover, in the figures, like referenced numerals designate corresponding parts throughout the different views.

DETAILED DESCRIPTION

A system that for analyzes an electronic circuit which is described by characterization data is disclosed, wherein an interpolation/approximation function reproduces, over an analysis interval, a monotony behavior of the electronic circuit by an automatic process.

Figure 1:
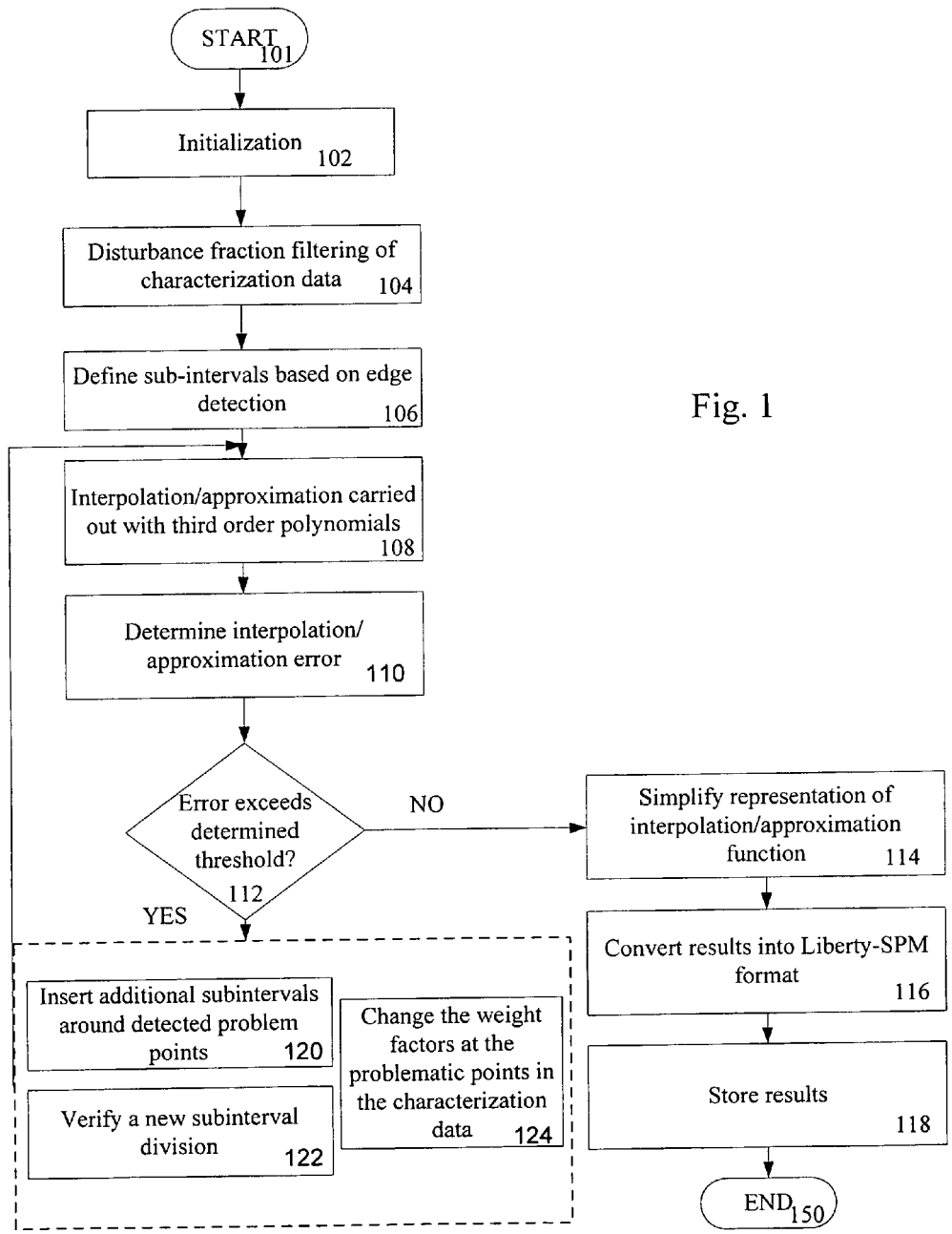
FIG. 1 shows a flowchart of a method that characterizes data.

FIG. 1 shows a flowchart of a method for characterizing data. Block 101 denotes the entry point and block 150 denotes the end point of the algorithm according to the invention. During an initialization, at block 102, a complete analysis interval is initially fixed as a single subinterval. A disturbance fraction filtering of characterization data is carried out in a functionality unit, at block 104, which is usually effected using adaptive Gaussian filtering. The filtering procedure is influenced by two pre-set threshold values and range parameters such that "relevant" edges and a monotony behavior of an electronic circuit are retained in the characterization data. This makes it possible to carry out an interpolation/approximation at a later stage based implicitly on the interference filtering with the threshold value prepared by interference filtering parameters.

An edge filtering procedure is carried out implicitly at block 104 using the adaptive process of interference filtering. For carrying out the edge filtering, algorithms from the digital image processing may be used, for example a Sobel operator, in order to detect extreme and inflection points in an interpolation/approximation function to be formed, which at these points signifies a change in the monotony behavior of the interpolation/approximation function.

During a numerical treatment in the form of discontinuity points or undifferentiable points, true edges present problems which may be solved by additional points in the surroundings of the problematic points in the characterization data. The edge detection contributes to detecting these problematic points and helps bring about an insertion of such additional points into the characterization data. The final set of characterization data, on which the interpolation/approximation is based, may be balanced by removing the individual points. The edge detection may also be used for the discretization of the interpolation/approximation function in subsequent EDA processes which have a discrete behavior.

After the interference fraction filtering and the edge detection in the functionality unit at block 104, the subintervals corresponding to the edges detected by the edge detection are defined at block 106. Subinterval limits associated with the subintervals correspond to the detected edges which are extreme and inflection points. Moreover, it is possible in the method for the subintervals to have different lengths, thereby allowing characterization data, in which the monotony behavior of the electronic circuit does not change with respect to a pre-set threshold value, to be disregarded for the calculation of the interpolation/approximation function and for the subsequent steps. The concept of emitting certain characterization data as a function of the monotony behavior was originally developed for reducing the size of NLDM tables.

In blocks 108 and 110, the interpolation/approximation is carried out with third order polynomials (cubic spline) over each subinterval and thus over the entire analysis interval and an interpolation/approximation error is determined according to various aspects, for example relative and absolute derivations, using, for example, the method of least squares or the chi-square method. he interpolation/approximation function may be calculated by solving an optimization problem or by solving a system of equations with additional conditions preserving monotony.

A subsequent check at block 112 establishes whether the interpolation/approximation error does not exceed a predetermined threshold value. If this is the case, the representation of the interpolation/approximation function is simplified at block 114, the results thereof are converted into the Liberty-SPM format at bloc 116 and stored at block 118, whereupon the algorithm ends at block 150.

Based on the principle of establishing the edges which are determined by the edge detection and the preceding interference fraction filtering, as subinterval limits, which ensures that the extreme and inflection points are located on the subinterval limits and thus the curve of subinterval functions and, in the entirety thereof, the curve of the interpolation/approximation function is monotonous within the subintervals, and consequently the actual monotony behavior of the electronic circuit is reproduced by the interpolation/approximation function, it is basically unnecessary to change weight factors in the characterization data or to insert additional subintervals.

By this method, monotony conditions which must fulfill the interpolation/approximation function, are automatically determined and considered, without necessitating manual intervention by an operator. The method is thus clearly more extensively automated compared to those of the prior art. Moreover, a simple global monotony behavior is not presumed, but the monotonous ranges are automatically determined.

In the event that the check at block 112 has a negative result, by way of an exception, optional functionality at block 120 and 122 may be provided which allow the insertion of additional subintervals around detected problem points at block 120 and also a verification of a new subinterval division at block 122. With a negative result, it is also optionally possible to change the weight factors at the problematic points in the characterization data at block 124. After processing these optional functionality units as required, the algorithm is continued at block 108 with the renewed interpolation/approximation. The detected edges and thus the changes in the monotony behavior may be used to analyze the electronic circuit and to control the EDA process, in which case the Liberty-SPM format for example is used.

The method is particularly also advantageous in that subinterval functions, also termed piecewise polynomials, are generated which reproduce the monotony behavior in various ranges (in the subintervals), in contrast to which prior art methods, controlled by value deviations, produce piecewise polynomials, from which this information (the monotony) cannot be taken, for example due to oscillations or overshooting and/or undershooting oscillators, because the tie points of the piecewise polynomials are derived merely on the basis of the value deviations.

Figure 2:
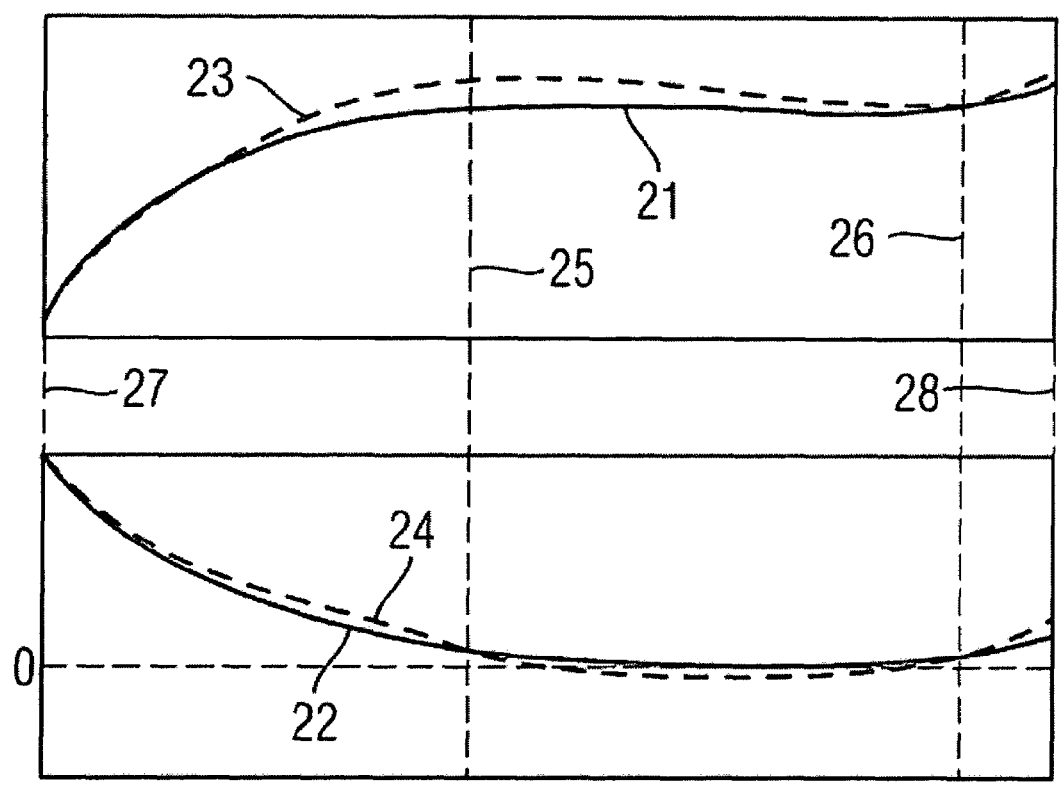
FIG. 2 shows a comparison between curves of interpolation/approximation functions and the associated first derivatives thereof.

FIG. 2 illustrates the circumstances for reproducing a monotony behavior by an interpolation/approximation function 21 and 23. A subinterval is given with a lower limit 27 and an upper limit 28. In the upper part of the figure, a cubic spline 23 is plotted over the subinterval, the spline including at a point 25 a local maximum and at a point 26 a local minimum. The curve 21 apparently takes a similar path, except that it is monotonous between the limits 27 and 28 and has no extreme values, in particular at the points 25 and 26.

In spite of this apparent similarity, the importance of the difference between the two curves 21 and 23 becomes clear when the (first) derivatives thereof are considered (shown in the lower part of FIG. 2), the derivative of curve 21 being denoted by reference numeral 22 and the derivative of curve 23 being denoted by reference numeral 24. It becomes apparent that the derivative curve 22 is merely tangent to a zero line and otherwise always runs above the line, whereas the derivative curve 24, i.e. the derivative of the cubic spline, intersects the zero line and runs both above and below this line. Thus, the graph illustrates the relationship and the significance of the monotony curve of the interpolation/approximation function to the derivation thereof, in particular with an apparently very similar curve of two interpolation/approximation functions. If it is assumed that in the EDA, the calculation of the "slew degradation" of an electronic circuit depends on the first derivation of the interpolation/approximation function, it becomes clear which effects the monotony curve of the interpolation/approximation function has in that the derivation may then possibly change the sign thereof, which represents not only a quantitative, but also a qualitative change in the derivation behavior.

Figure 3:
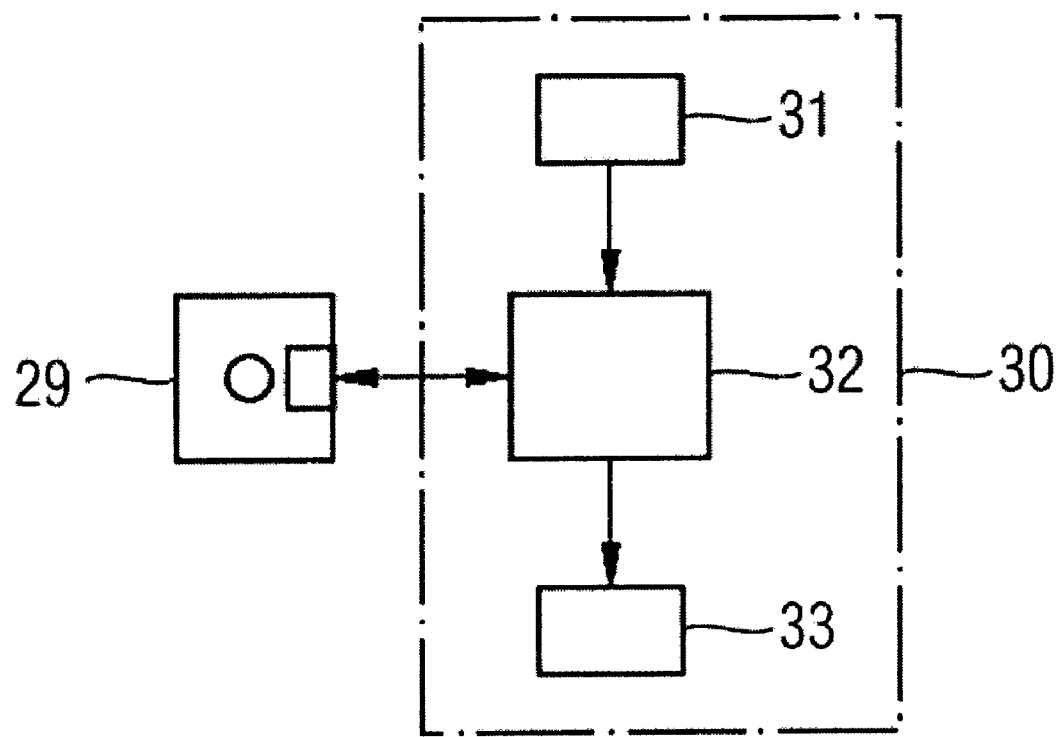
FIG. 3 shows a schematic illustration of a device for analyzing an electronic circuit.
Figure 4:
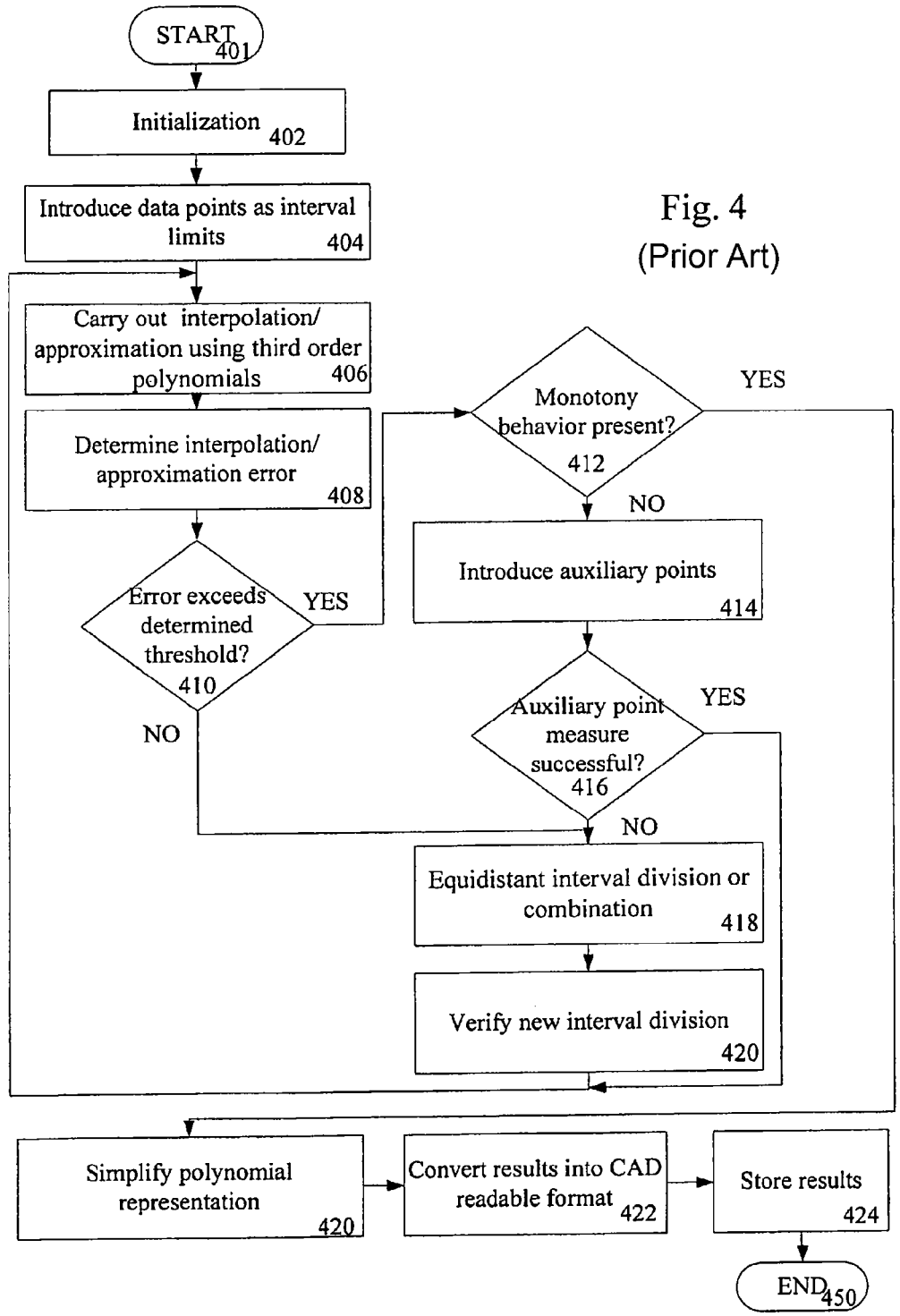
FIG. 4 shows a flowchart of a method according to the prior art.

FIG. 3 schematically shows a computer system 30 for analyzing an electronic circuit described by characterization data. The computer system 30 comprises an input unit 31 for providing the characterization data. The input system 30 also comprises a control unit 32 which may be equipped to carry out the previously described algorithm in FIG. 1. In addition, the computer system 30 comprises an output unit 33 to issue the representation of the interpolation/approximation function in Liberty-SPM format.

In connection with a computer program product 29 or an electronically readable data carrier comprising a computer program or electronically readable control information, the computer system 30 at least executes the algorithm described in FIG. 1.

The input unit 31 may comprise a reading device for reading a storage medium or any block- or character-orientated input devices, for example a keyboard, and the output unit 33 may comprise writing devices for writing on a storage medium or on any block- or character-orientated output devices, for example monitors, printers, plotters. The input unit 31 and the output unit 33 may also comprise an interface unit, for example a network interface, for correspondingly sending and receiving the relevant data. The input unit 31 may also be connected to measuring devices for detecting the characterization data.

Finally, it should be pointed out that although the disclosure may be designed for Liberty-SPM format, and may be restricted to at the most six-dimensional characterization data, the method may apply to characterization data having any number of dimensions.

It is therefore intended that the foregoing detailed description be regarded as illustrative rather than limiting, and that it be understood that it is the following claims, including all equivalents, that are intended to define the spirit and scope of this invention.

The invention claimed is:

1. A method for analyzing an electronic circuit described by characterization data, an interpolation/approximation function from the characterization data being formed over an analysis interval for analyzing the electronic circuit, comprising:
- applying an edge detection to the characterization data to determine edges in the characterization data
- subdividing the analysis intervals into subintervals, wherein the subinterval limits between the subintervals correspond to the edges from applying the edge detection; and
- interpolating/approximating the characterization data in each subinterval by a respective subinterval function, wherein the subinterval functions at the subinterval limits satisfy a predetermined interpolation condition and define the interpolation/approximation function over the analysis interval, and wherein the interpolation/approximation function is continuously differentiable and exhibits in the subintervals a monotonous curve.

2. The method according to claim 1, wherein interpolating/approximating comprises interpolating/approximating with a two-fold continuously partially differentiable function.

3. The method according to claim 2, wherein interpolating/approximating comprises interpolating/approximating with a function for analyzing formed as a function of at least one variable.

4. The method according to claim 1, further comprising interference fraction filtering the characterization data for carrying out the edge detection.

5. The method according to claim 4, wherein interference fraction filtering comprises multi-variable Gaussian filtering.

6. The method according to claim 4, wherein the interference fraction filtering comprises adaptive interference fraction filtering.

7. The method according to claim 4, comprising setting parameters of the interference fraction filtering before carrying out the interference fraction filtering.

8. The method according to claim 1, wherein applying the edge detection comprises edge detection from a digital image processing.

9. The method according to claim 1, applying the edge detection comprises determining numerical problem points in the characterization data and, in the surroundings of said problem points, inserting additional auxiliary points into the characterization data before subdividing the analysis intervals.

10. The method according to claim 1, further comprising defining additional subintervals defined to improve an interpolation/approximation accuracy before interpolating/approximating the characterization data.

11. The method according to claim 1, further comprising combining individual subintervals to reduce the amount of characterization data to be considered in the interpolation/approximation before interpolating/approximating the characterization data.

12. The method according to claim 1, wherein interpolating/approximating the characterization data is carried out by solving an optimization problem.

13. The method according to claim 1, wherein interpolating/approximating the characterization data comprises solving a system of equations with predetermined boundary conditions.

14. The method according to claim 1, wherein interpolating/approximating the characterization data comprises using at least one of a method of interval squares, a chi-square method or an evaluation of individual relative/absolute deviation values to determine an error in the interpolation/approximation function.

15. The method according to claim 1, further comprising inserting or changing data weight factors into the characterization data to improve an interpolation/approximation accuracy before interpolating/approximating the characterization data.

16. The method according to claim 1, wherein interpolating/approximating the characterization data comprises converting the characterization data into a Liberty-SPM format to analyze the electronic circuit.

17. The method according to claim 1, wherein the edge detection is used for the discretization of the interpolation/approximation function in subsequent EDA processes which exhibit a discrete behavior.

18. A device for analyzing an electronic circuit described by characterization data, the device configured such that it forms an interpolation/approximation function from the characterization data over an analysis interval to analyze the electronic circuit, comprising:
- an input unit operable to provide the characterization data of the electronic circuit; and a control unit, wherein the control unit is operable to:
  - apply an edge detection to the characterization data to determine edges in the characterization data;
  - subdivide the analysis interval into subintervals, wherein subinterval limits between the subintervals correspond to the edges determined by the edge detection; and
  - interpolate/approximate the characterization data in each subinterval by a respective subinterval function, wherein the subinterval functions at the subinterval limits satisfy a predetermined interpolation condition and define the interpolation/approximation function over the analysis interval, and wherein the interpolation/approximation function is continuously differentiable and exhibits a monotonous curve in the subintervals, and output means for outputting the interpolation/approximation function.

19. A computer program product for analyzing an electronic circuit described by characterization data, the device being configured such that it forms an interpolation/approximation function from the characterization data over analysis intervals to analyze the electronic circuit comprising:
- a computer useable medium having computer readable code embodied in the medium, the computer readable code comprising:
  - computer readable code executable to apply an edge detection to the characterization data to determine edges in the characterization data;
  - computer readable code executable to subdivide the analysis intervals into subintervals, wherein subinterval limits between the subintervals correspond to the edges from applying the edge detection; and
  - computer readable code executable to interpolate/approximate the characterization data in each subinterval by a respective subinterval function, wherein the subinterval functions at the subinterval limits satisfy a predetermined interpolation condition and define the interpolation/approximation function over the analysis interval, and wherein the interpolation/approximation function is continuously differentiable and exhibits in the subintervals a monotonous curve.

20. An electronically readable data carrier with electronically readable control information which when used in a computer system carries out a method for analyzing an electronic circuit described by characterization data, an interpolation/approximation function from the characterization data being formed over an analysis interval for analyzing the electronic circuit, comprising:

applying an edge detection to the characterization data to determine edges in the characterization data subdividing the analysis intervals into subintervals, wherein the subinterval limits between the subintervals correspond to the edges from applying the edge detection; and interpolating/approximating the characterization data in each subinterval by a respective subinterval function, wherein the subinterval functions at the subinterval limits satisfy a predetermined interpolation condition and define the interpolation/approximation function over the analysis interval, and wherein the interpolation/approximation function is continuously differentiable and exhibits in the subintervals a monotonous curve.

21. A device for analyzing an electronic circuit described by characterization data, the device being configured such that it forms an interpolation/approximation function from the characterization data over an analysis interval to analyze the electronic circuit, comprising:

input means for providing the characterization data of the electronic circuit; and control means, wherein the control means is configured for:

applying an edge detection to the characterization data to determine edges in the characterization data;

subdividing the analysis interval into subintervals, wherein subinterval limits between the subintervals correspond to the edges determined by the edge detection; and interpolating/approximating the characterization data in each subinterval by a respective subinterval function, wherein the subinterval functions at the subinterval limits satisfy a predetermined interpolation condition and define the interpolation/approximation function over the analysis interval, and wherein the interpolation/approximation function is continuously differentiable and exhibits a monotonous curve in the subintervals, and output means for outputting the interpolation/approximation function.

* * * * *